US012732069B1

(12) United States Patent
Bonny et al.

(10) Patent No.: US 12,732,069 B1
(45) Date of Patent: Sep. 8, 2026

(54) ELECTRIC DRIVE ASSEMBLY WITH PLANETARY GEAR REDUCTION

(71) Applicant: Hydro-Gear Limited Partnership, Sullivan, IL (US)

(72) Inventors: Nathan W. Bonny, Shelbyville, IL (US); Ryan S. Buescher, Neoga, IL (US); Henry J. Hansen, Zionsville, IN (US)

(73) Assignee: Hydro-Gear Limited Partnership, Sullivan, IL (US)

( * ) Notice: Subject to any disclaimer, the term of this patent is extended or adjusted under 35 U.S.C. 154(b) by 395 days.

(21) Appl. No.: 18/314,578

(22) Filed: May 9, 2023

Related U.S. Application Data

(63) Continuation of application No. 16/694,413, filed on Nov. 25, 2019, now Pat. No. 11,705,786, which is a continuation-in-part of application No. 16/518,025, filed on Jul. 22, 2019, now Pat. No. 11,166,410.

(60) Provisional application No. 62/702,086, filed on Jul. 23, 2018.

(51) Int. Cl.

| | |
|---|---|
| ***H02K 11/00*** | (2016.01) |
| ***B60T 13/74*** | (2006.01) |
| ***F02N 15/04*** | (2006.01) |
| ***G01R 33/07*** | (2006.01) |
| ***H02K 5/04*** | (2006.01) |
| ***H02K 5/16*** | (2006.01) |
| ***H02K 5/18*** | (2006.01) |

(Continued)

(52) U.S. Cl.
CPC ............ *H02K 11/33* (2016.01); *B60T 13/746* (2013.01); *F02N 15/046* (2013.01); *G01R 33/072* (2013.01); *H02K 5/04* (2013.01); *H02K 5/16* (2013.01); *H02K 5/18* (2013.01); *H02K 5/22* (2013.01)

(58) Field of Classification Search
CPC . H02K 11/33; H02K 5/04; H02K 5/16; H02K 5/18; H02K 5/22; B60T 13/746; F02N 15/046; G01R 33/072
See application file for complete search history.

(56) References Cited

U.S. PATENT DOCUMENTS

| | | | | |
|---|---|---|---|---|
| 7,199,496 | B2 | 4/2007 | Suzuki et al. | |
| 10,004,142 | B1 * | 6/2018 | Wightman | H05K 3/368 |
| 10,312,768 | B2 | 6/2019 | Tomizawa et al. | |

(Continued)

FOREIGN PATENT DOCUMENTS

| | | |
|---|---|---|
| KR | 20180023721 | 3/2018 |

*Primary Examiner* — Thomas Truong
(74) *Attorney, Agent, or Firm* — Neal, Gerber & Eisenberg LLP

(57) ABSTRACT

A drive includes an electric motor disposed in a housing and driving a motor shaft, a Hall effect sensor adjacent to the motor, a power and control assembly, and a pinion gear driven by the motor shaft. A planetary gear reduction assembly is driven by the pinion gear, and an output axle has an axis of rotation that is offset from and parallel to the motor shaft axis of rotation. The reduction drive is substantially bilaterally symmetrical about a plane passing through the motor shaft axis of rotation and the output axle axis of rotation. The power and control assembly comprises a control board oriented perpendicular to a power board and includes a heat dissipation apparatus that applies multi-point, localized, indirect pressure to a plurality of field effect transistors mounted on the power board.

22 Claims, 18 Drawing Sheets

(51) Int. Cl.
*H02K 11/33* (2016.01)
*H02K 5/22* (2006.01)

(56) References Cited

U.S. PATENT DOCUMENTS

| | | | | |
|---|---|---|---|---|
| 2006/0082975 | A1 | 4/2006 | Caines et al. | |
| 2006/0180366 | A1 | 8/2006 | Brill et al. | |
| 2010/0236845 | A1 | 9/2010 | Ishii et al. | |
| 2011/0130238 | A1 | 6/2011 | Schoon | |
| 2013/0175854 | A1 | 7/2013 | Chamberlin et al. | |
| 2013/0193812 | A1 | 8/2013 | Oishi | |
| 2013/0207491 | A1* | 8/2013 | Hatfield | H02K 21/12 310/71 |
| 2014/0034430 | A1* | 2/2014 | Fuse | F16D 65/567 188/72.4 |
| 2014/0326530 | A1 | 11/2014 | Asao et al. | |
| 2014/0333120 | A1 | 11/2014 | Pozzo | |
| 2014/0349801 | A1 | 11/2014 | Brenner | |
| 2015/0075923 | A1* | 3/2015 | Jang | F16D 65/14 188/162 |
| 2016/0039277 | A1 | 2/2016 | Falls et al. | |
| 2016/0264265 | A1 | 9/2016 | Garland et al. | |
| 2017/0001513 | A1 | 1/2017 | Kuroda et al. | |
| 2017/0234425 | A1* | 8/2017 | Sasahara | F15B 11/08 60/487 |
| 2017/0353082 | A1 | 12/2017 | Hamada | |
| 2018/0252266 | A1* | 9/2018 | Oketani | F16C 19/50 |
| 2018/0287466 | A1 | 10/2018 | Kim et al. | |
| 2019/0312491 | A1 | 10/2019 | Yamamoto | |
| 2020/0049241 | A1* | 2/2020 | Shimizu | H02K 7/116 |
| 2020/0352041 | A1 | 11/2020 | Bulovic et al. | |

* cited by examiner 110
112
119
127
120c
120b
120a
120
121
122
123
125
130
114

125
125b
123
124
126
125a
114
116
130
130a
130b
129

112
120
118
130
140
117
141
143
110

112
120
130
152
154
150
155
131
136
156
132
140
133
141
145

ELECTRIC DRIVE ASSEMBLY WITH PLANETARY GEAR REDUCTION

CROSS REFERENCE

This application is a continuation of U.S. patent application Ser. No. 16/694,413, filed on Nov. 25, 2019, which is a continuation-in-part of U.S. patent application Ser. No. 16/518,025, now U.S. Pat. No. 11,166,410, filed on Jul. 22, 2019, which claims the benefit of U.S. Provisional Pat. App. No. 62/702,086, filed on Jul. 23, 2018. The contents of these prior applications are incorporated herein by reference in their entirety.

BACKGROUND OF THE INVENTION

This application relates to an electric planetary reduction drive incorporating an electric motor and reduction gearing. Such a drive may be used for applications such as a ground drive for a lawn mower, utility vehicle or the like, although other applications are possible.

SUMMARY OF THE INVENTION

A CAN Bus-enabled, electrically-powered, offset planetary reduction drive having a protected, integrated power and control module is disclosed herein. This design provides a relatively compact envelope for use with an electric or hybrid drive lawn mower or other utility vehicle. A versatile mounting interface is provided so that this electric drive can be oriented as needed to protect power and control conductors.

A better understanding of the invention will be obtained from the following detailed descriptions and accompanying drawings, which set forth illustrative embodiments that are indicative of the various ways in which the principals of the invention may be employed.

DETAILED DESCRIPTION OF THE DRAWINGS

Figure 1:
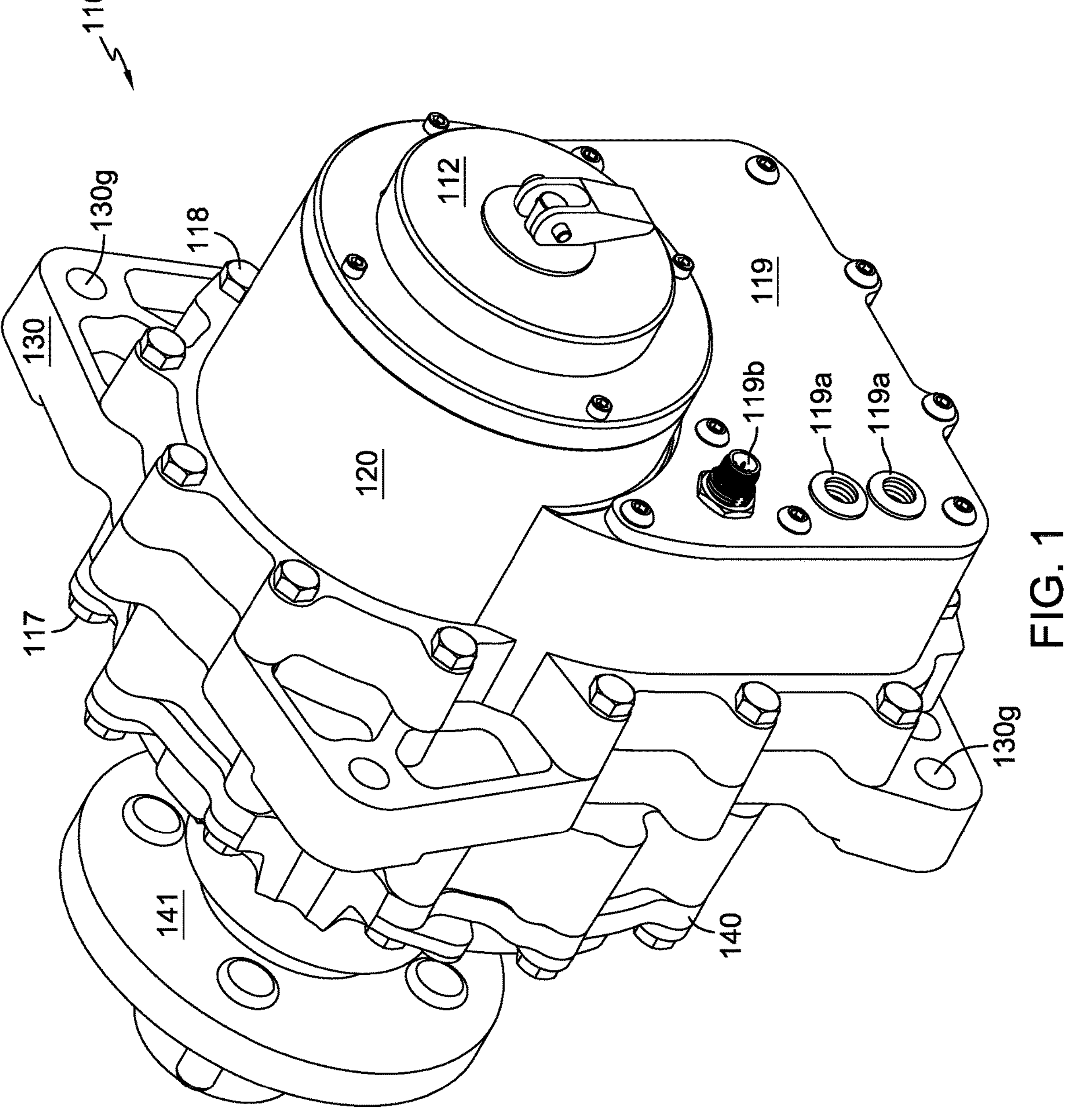
FIG. 1 is an external perspective view of an electric offset planetary reduction drive in accordance with the disclosure herein.

The description that follows describes, illustrates and exemplifies one or more embodiments of the invention in accordance with its principles. This description is not provided to limit the invention to the embodiment(s) described herein, but rather to explain and teach the principles of the invention in order to enable one of ordinary skill in the art to understand these principles and, with that understanding, be able to apply them to practice not only the embodiment(s) described herein, but also any other embodiment that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers or serial numbers in cases where such labeling facilitates a more clear description. Additionally, the drawings set forth herein are not necessarily drawn to scale, do not necessarily indicate assembly sequence, and in some instances proportions may have been exaggerated to more clearly depict certain features. As stated above, this specification is intended to be taken as a whole and interpreted in accordance with the principles of the invention as taught herein and understood by one of ordinary skill in the art.

Figure 8:
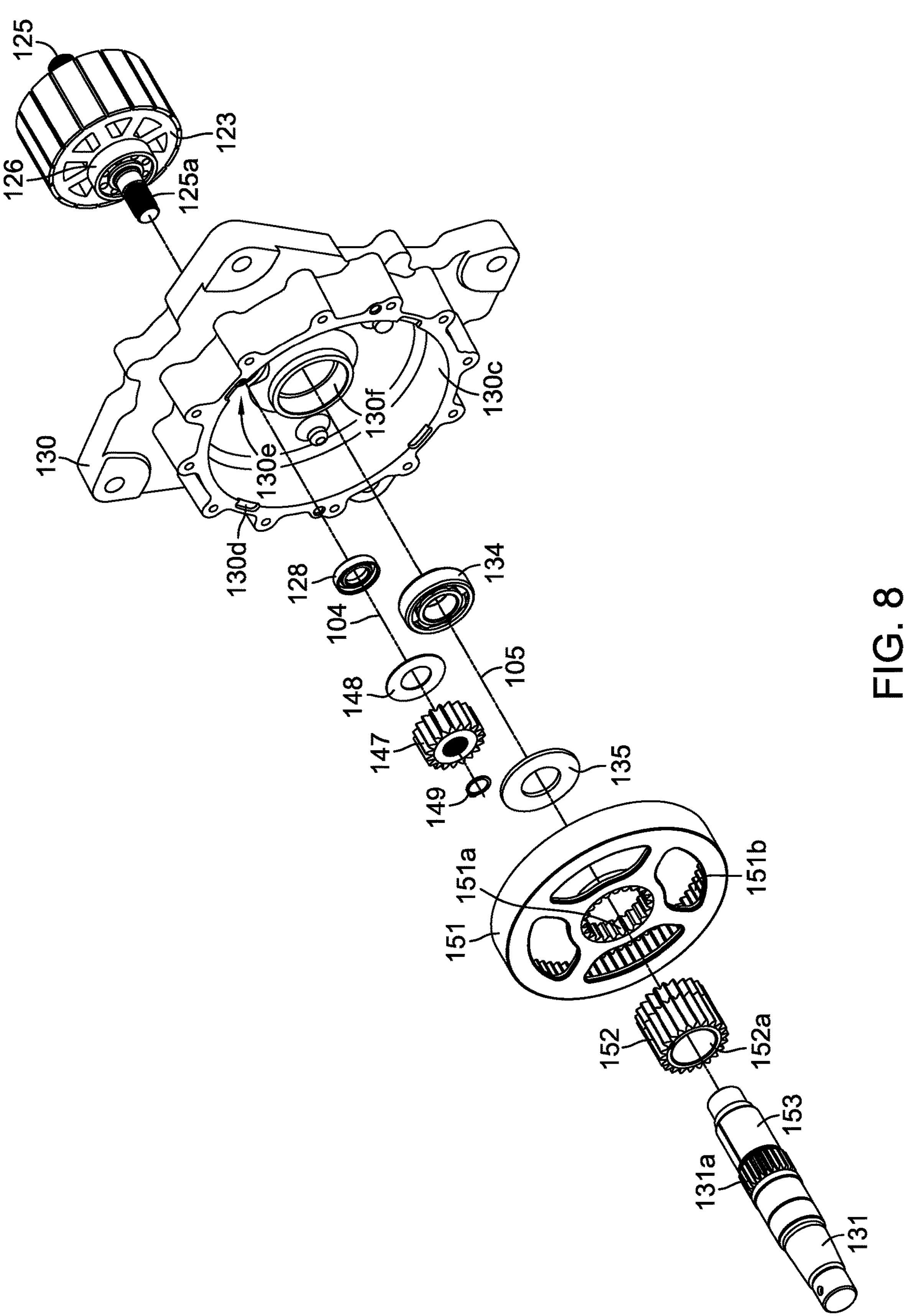
FIG. 8 is a final partially exploded view of selected components of the planetary reduction drive of FIG. 1.
Figure 9:
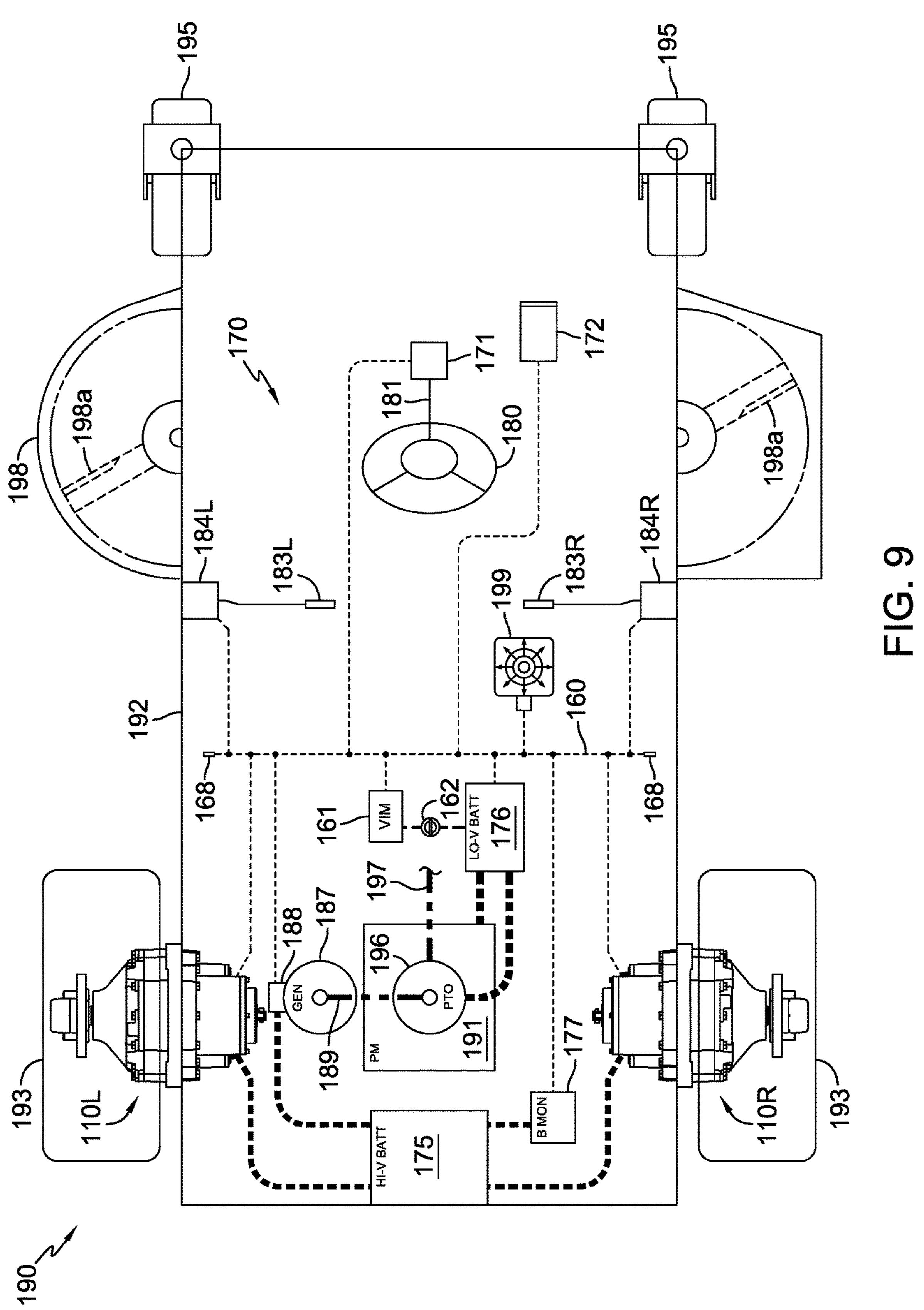
FIG. 9 is a partially schematic view of a hybrid drive vehicle incorporating the electric offset planetary reduction drive disclosed herein.
Figure 10:
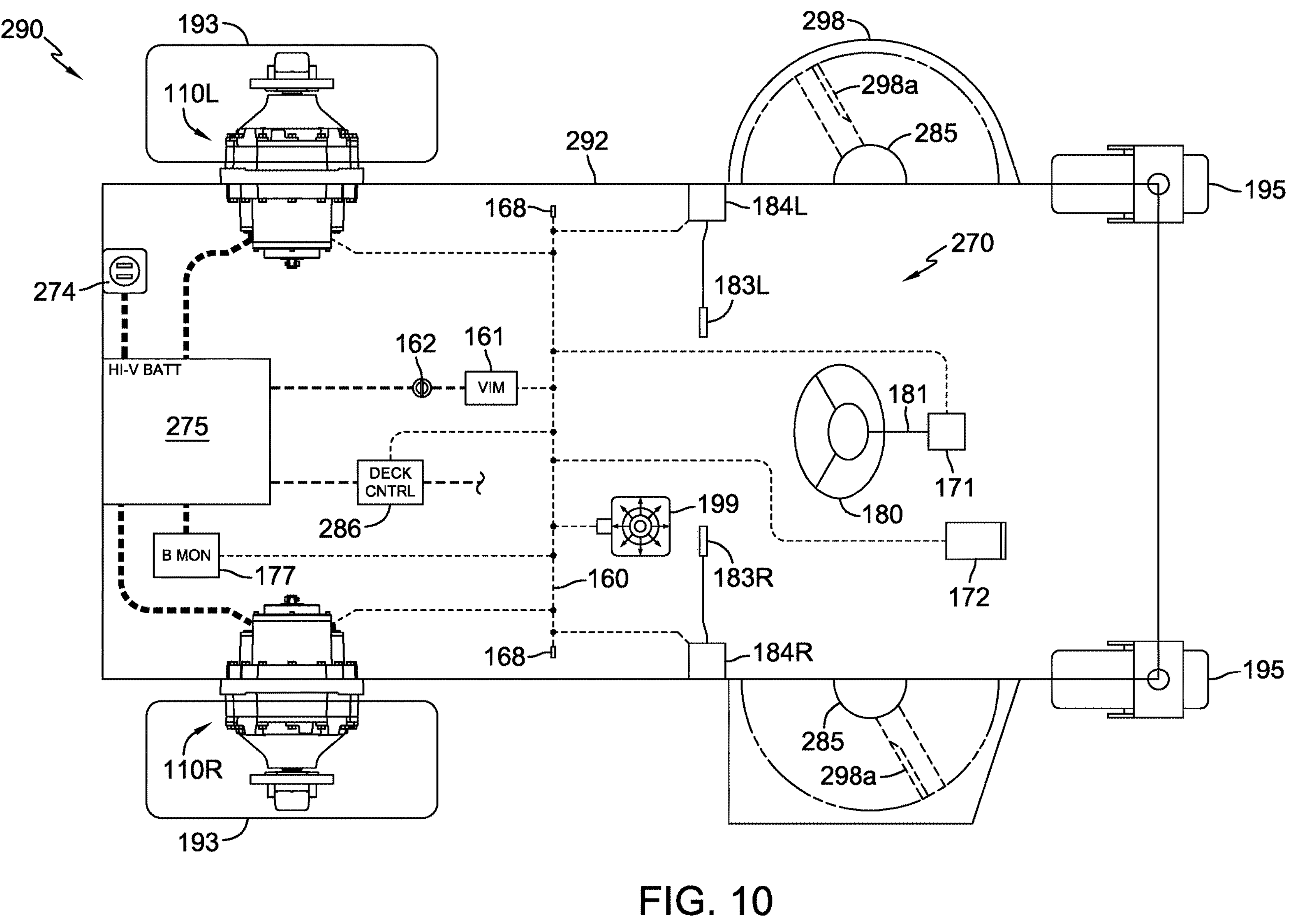
FIG. 10 is a partially schematic view of an electric drive vehicle incorporating the electric offset planetary reduction drive disclosed herein.
Figure 11:
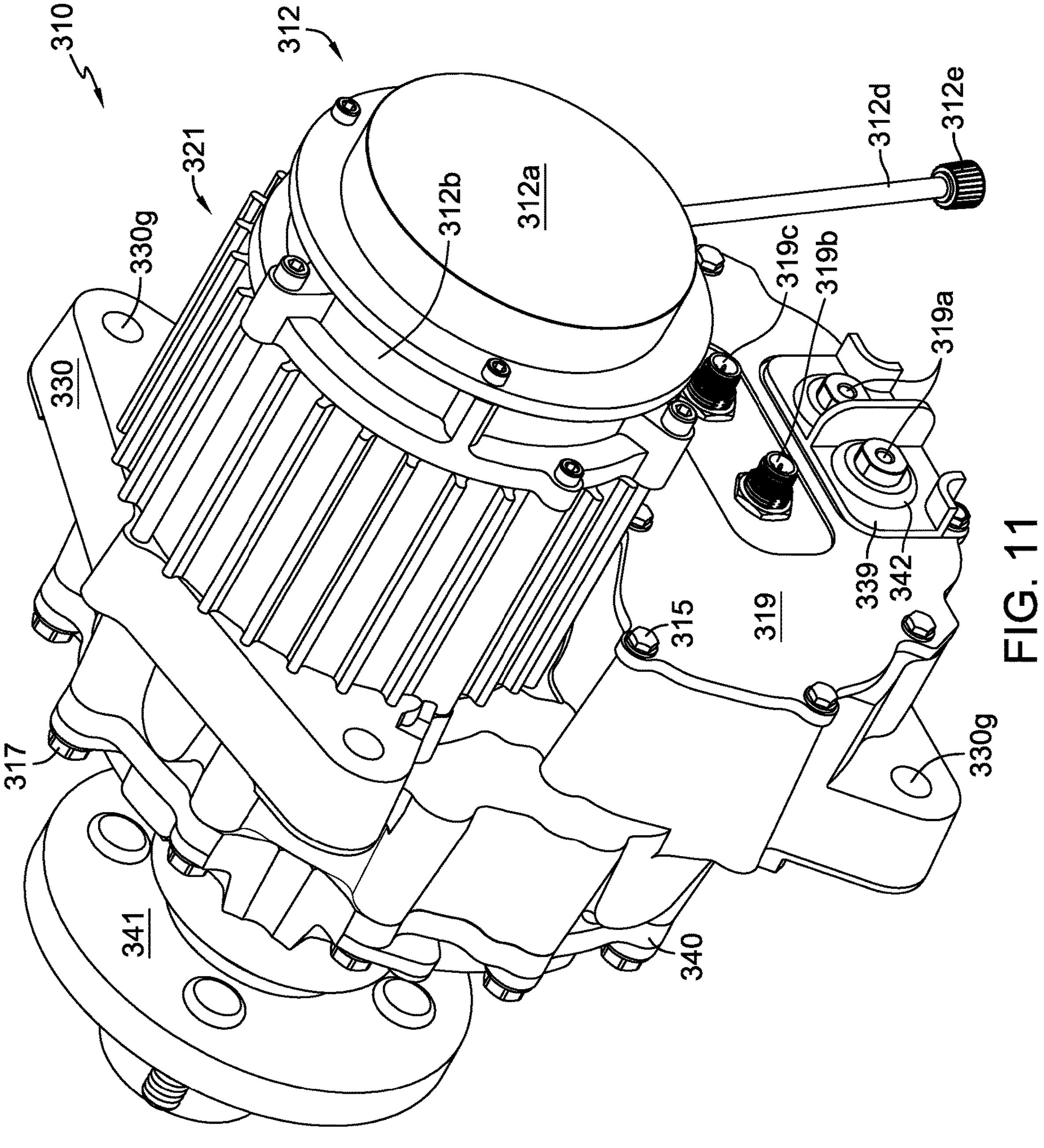
FIG. 11 is an external perspective view of a drive assembly in accordance with the disclosure herein.

An electric planetary reduction drive 110 is depicted in FIGS. 1-8, and two different vehicle applications for electric drive 110 are shown in FIGS. 9 and 10. Electric planetary reduction drive 110 includes a housing comprising a motor housing 120 and an axle housing 140 attached to opposite sides of a center housing 130 by means of fasteners 117, 118. Four mounting thru-holes **130*g* are arranged in a square pattern centered about the rotational axis of axle 131 such that electric drive 110 may be mounted on a bolt circle pattern oriented as needed for a particular vehicle configuration. That is, the mating bolt circle of a vehicle frame mounting interface can be oriented to any desired position about the axle rotational axis. This allows positioning of the mounted electric drive 110 such that power and control/communication conductors that are routed and attached to electric drive 110 may be better protected. The center housing 130 mounting structure may be positioned to either side of a mating vehicle frame mounting structure for additional versatility in vehicle configuration. A wheel hub 141 is driven by axle 131 to provide the ultimate output of reduction drive 110. Wheel hub 141 incorporates a hub cap 143 covering axle nut and cotter pin 145**.

Figure 2:
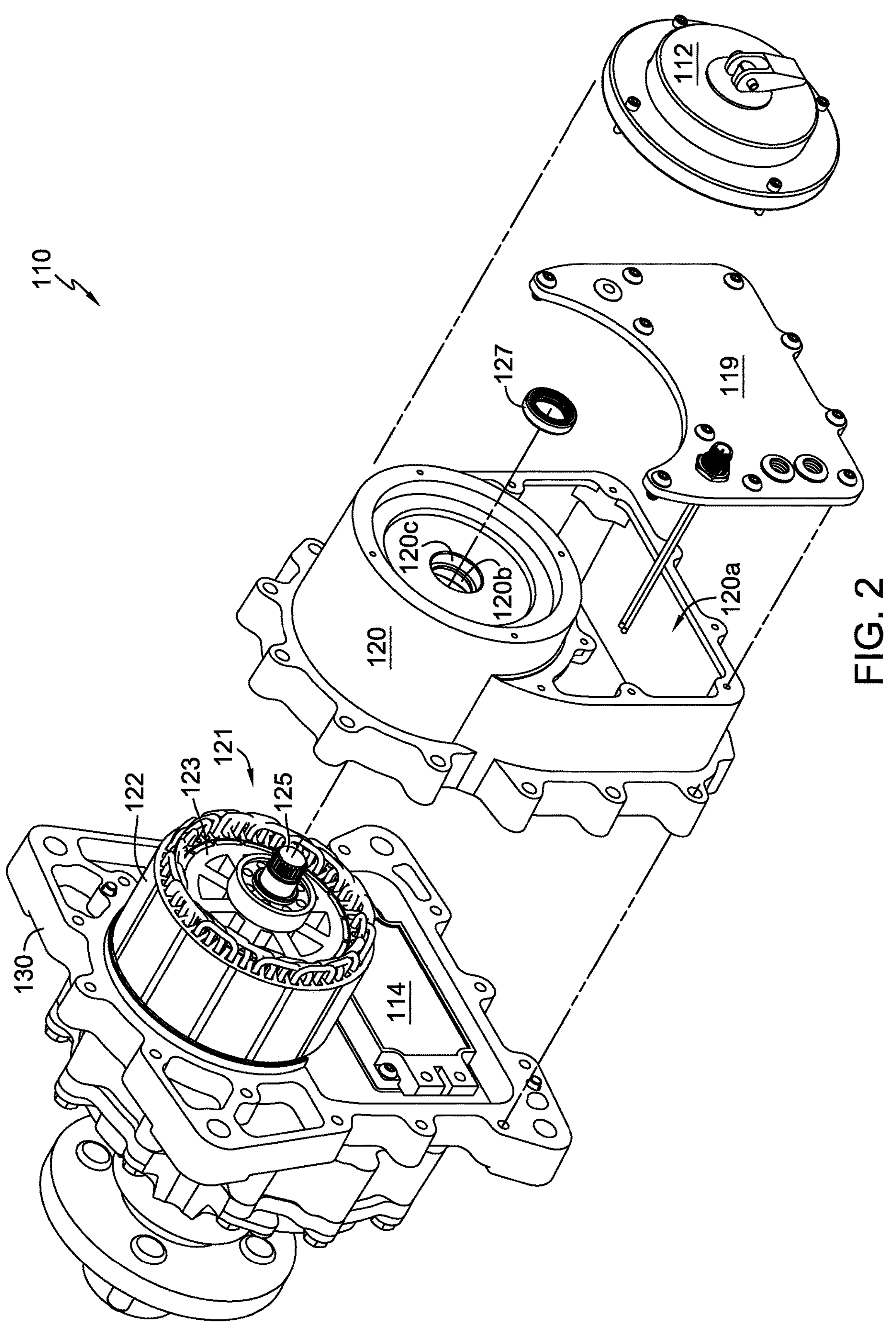
FIG. 2 is a partially exploded view of the electric motor components of the reduction drive of FIG. 1.
Figure 3:
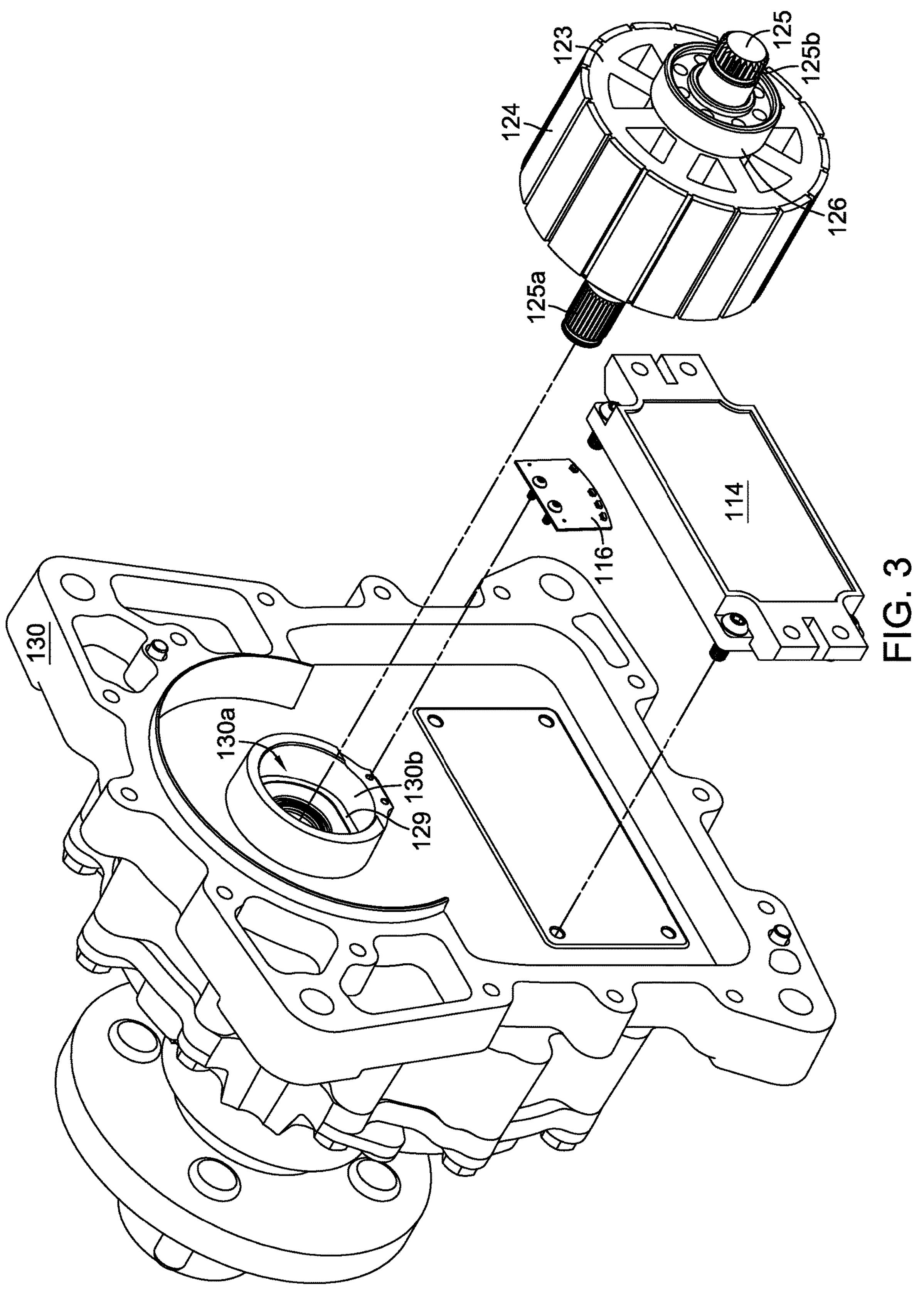
FIG. 3 is a partially exploded view of selected components of the reduction drive of FIG. 1.
Figure 4:
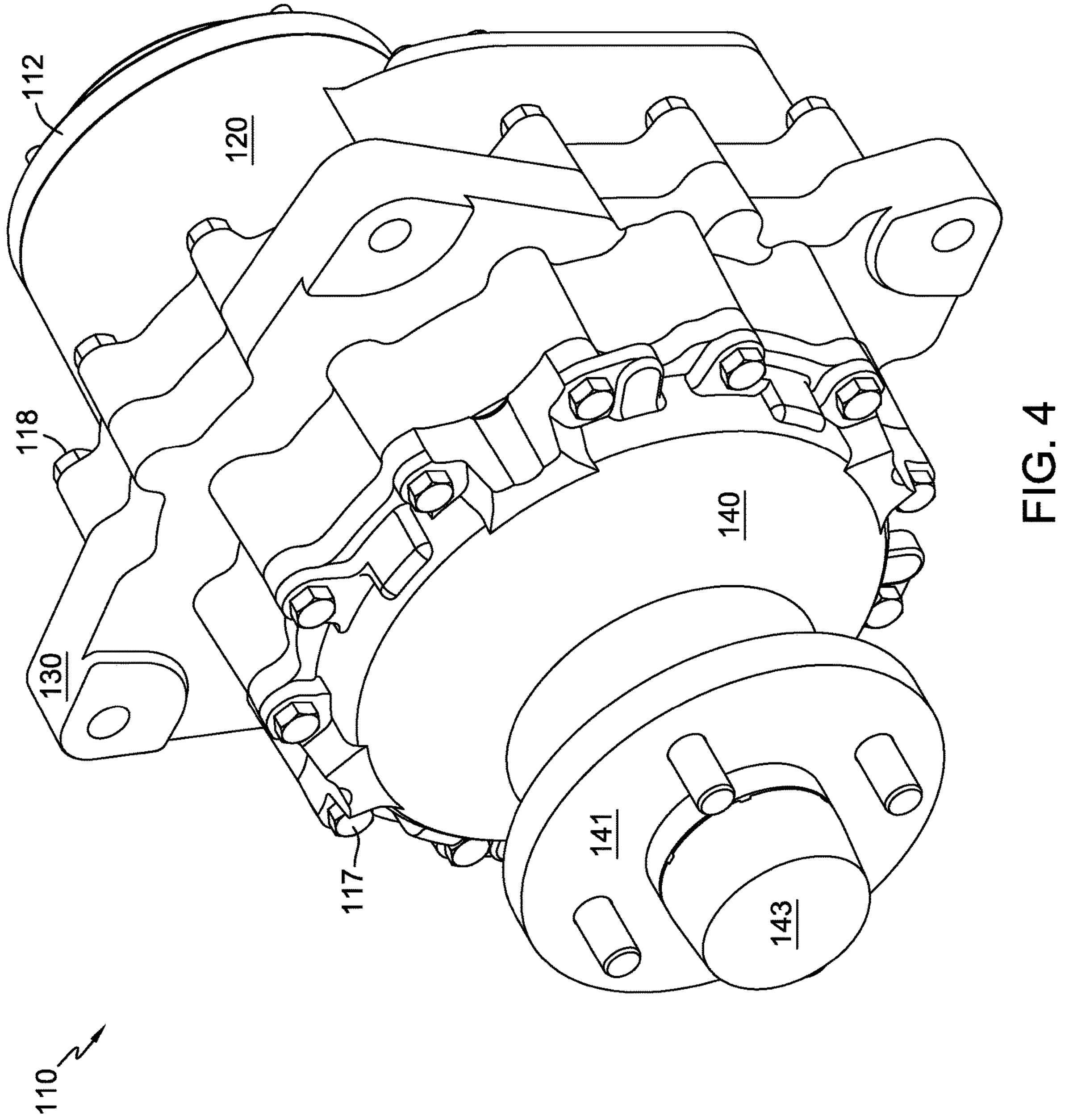
FIG. 4 is another external perspective view of the electric offset planetary reduction drive of FIG. 1.
Figure 5:
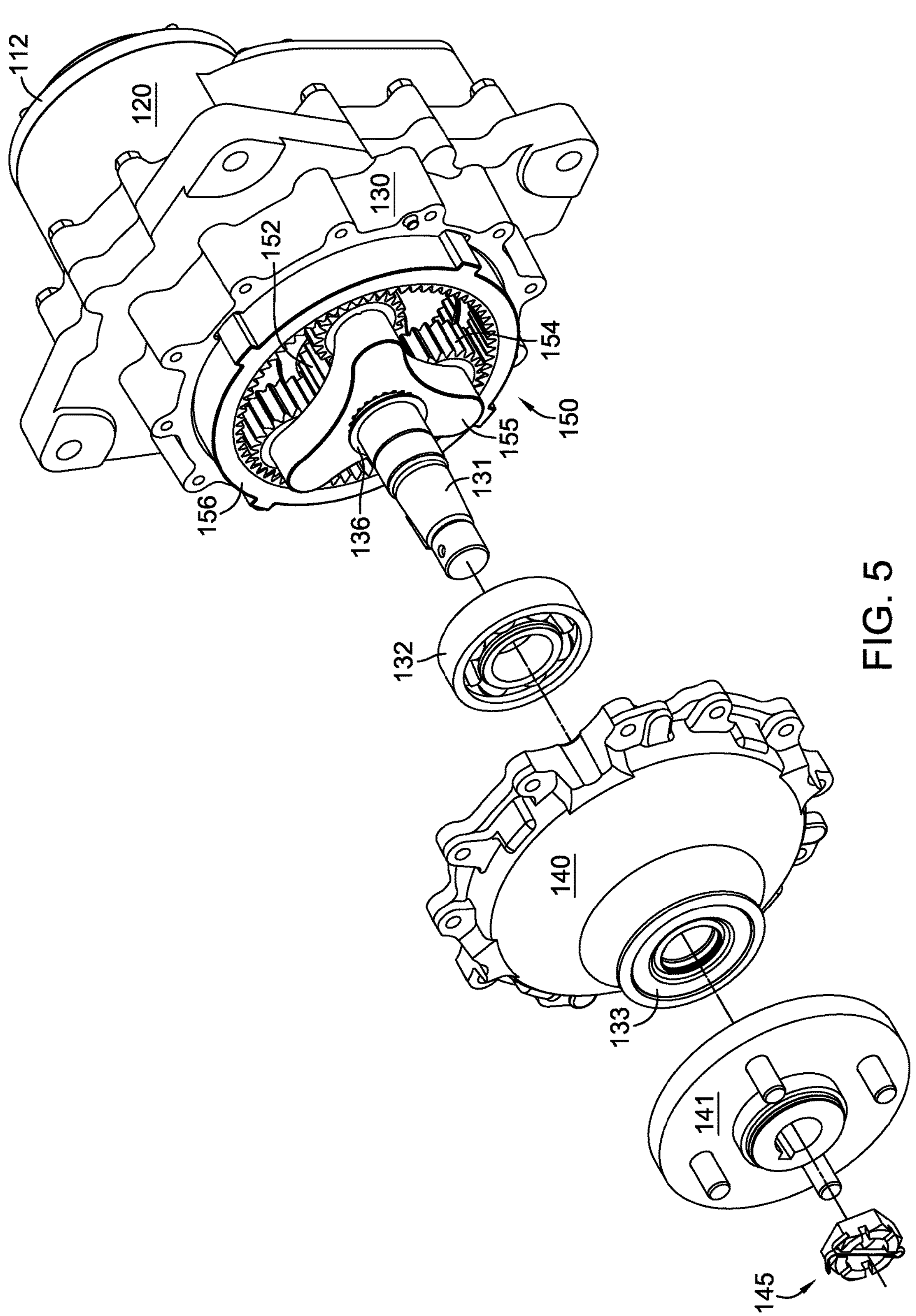
FIG. 5 is a partially exploded view of selected drive components of the planetary reduction drive of FIG. 1.

As shown most clearly in the exploded views of FIGS. 2, 3 and 8, a brushless electric motor 121 is disposed in motor housing 120, and comprises stator 122 (which is pre-installed in housing 120 during assembly), rotor 123 and magnets 124. Hall effect sensor board 116 is located adjacent to bearing pocket 130*b* (for one of a pair of sealed bearings 126) through which motor output shaft 125 is supported. A CAN Bus-enabled power and control module 114 is shown mounted to a surface of center housing 130. Power and control module 114 provides electrical power to electric motor 121 and controls electric motor 121 as communicated via CAN Bus network. Motor housing 120 provides an access chamber 120*a* that protects certain electrical components such as power and signal conductors. Chamber 120*a* extends entirely through motor housing 120, extending from a proximal side of the motor housing 120 that is secured to center housing 130, to a distal side of motor housing 120. A motor housing electrical access cover 119 is secured to this distal side of motor housing 120 to close chamber 120*a*, and power terminals 119*a* and CAN Bus connector 119*b* are provided thereon. Thus, this housing design provides easy access to power and control module 114 without the need for a more complete disassembly of the unit.

The output shaft 125 extends through electric motor 121 and is supported on each end of the rotor 123 by a bearing 126, one of which is disposed in bearing pocket 130*b* in center housing 130 and the other of which is disposed in bearing pocket 120*b* in motor housing 120. A spring-biased electric brake 112 is attached externally to the distal side of motor housing 120 and is engaged to splines 125*b* of motor output shaft 125. Seal 127 is seated in seal pocket 120*c* in motor housing 120 and isolates brake 112 from electric motor 121 to prevent contamination of electric motor 121.

Center housing 130 includes a through opening 130*a* for output shaft 125, and seal 128 is provided in seal pocket 130*e* to isolate electric motor 121 from planetary reduction assembly 150 which preferably runs in oil. Splines 125*a* are provided on output shaft 125 to engage the pinion gear 147 that drives the planetary reduction assembly 150 as discussed below. Wave spring 129 is disposed between a bearing 126 and center housing 130 to provide an axial biasing force to the rotor 123. In the embodiment depicted, this axial biasing force is provided through bearing 126.

As shown most clearly in the exploded views of FIGS. 5-8, a two stage planetary reduction assembly 150 is provided, incorporating a rotatable first stage ring gear 151 and a fixed second stage ring gear 156. As will be noted, motor output shaft 125 has a first axis of rotation 104, and axle 131 has a second axis of rotation 105 that is parallel to and offset from the first axis of rotation 104. More specifically, motor output shaft 125 drives a pinion gear 147 disposed inside center housing 130. Pinion gear 147 is engaged to and drives the rotatable first stage ring gear 151 by means of gear form 151*b*. Washer 148 and retaining ring 149 may be incorporated to assist in mounting and locating the pinion gear 147. Washer 148 reduces wear at the interface between pinion gear 147 and the center housing 130. Ring gear 151 is disposed in a rotation pocket 130*c* formed in center housing 130 and is engaged to and rotates the sun gear 152 by means of gear form 151*a*. It will be seen in this embodiment that the drive train arrangement of reduction drive 110 is substantially symmetrical about a plane formed by axes of rotation 104, 105.

Figure 6:
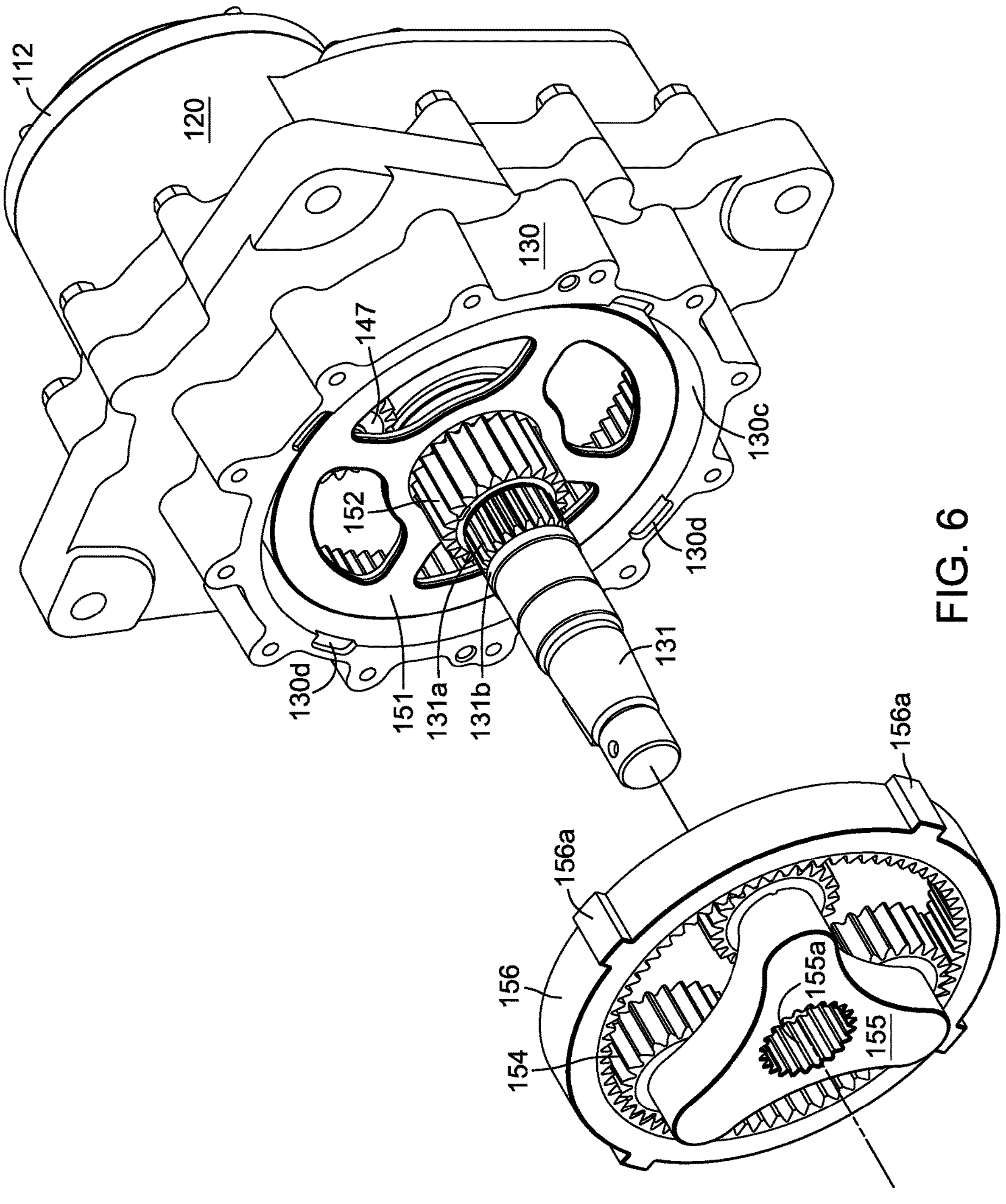
FIG. 6 is a further partially exploded view of selected components of the planetary reduction drive of FIG. 1.
Figure 7:
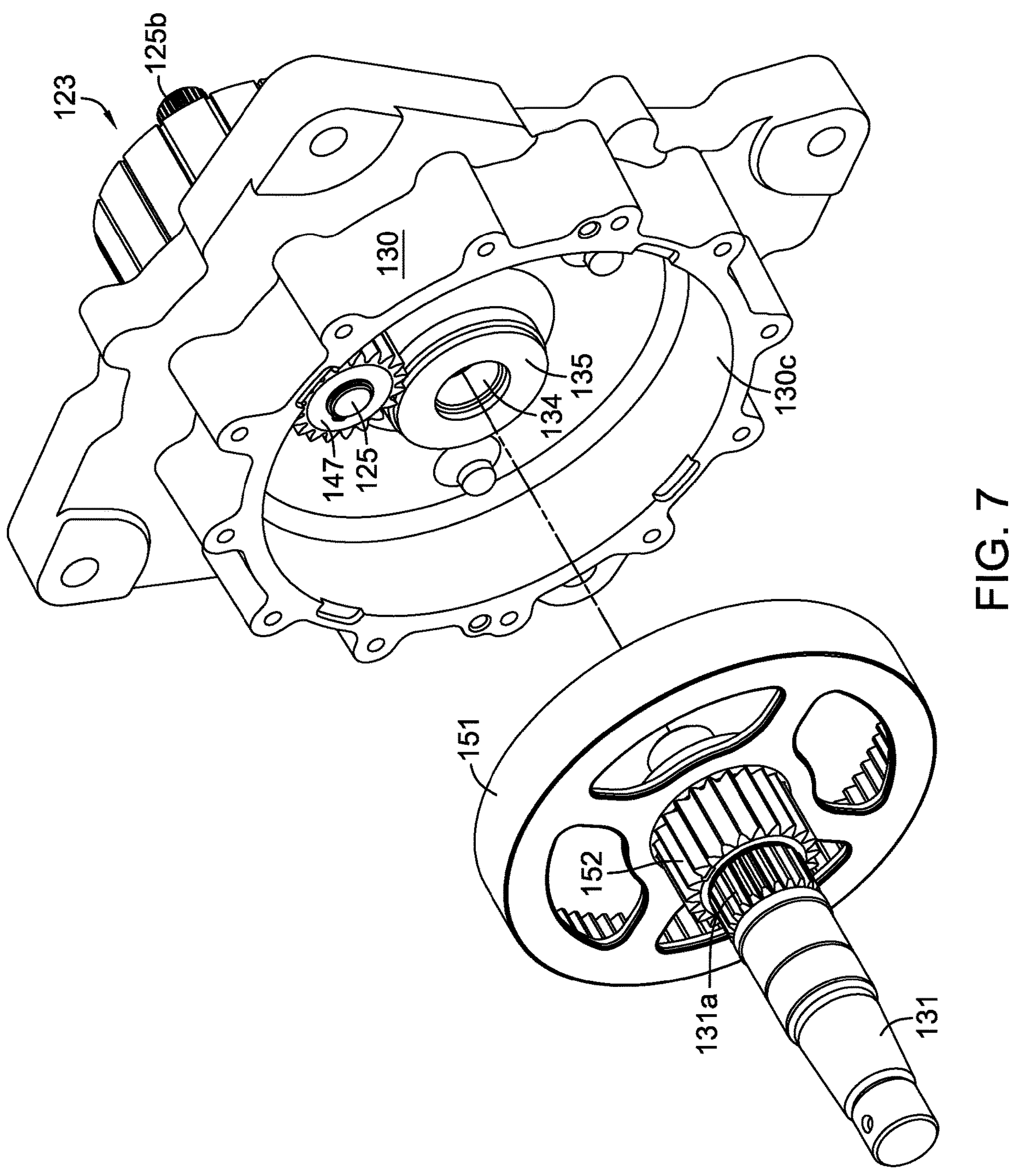
FIG. 7 is a still further partially exploded view of selected drive components of the planetary reduction drive of FIG. 1.

As seen in, e.g., FIG. 6, the second stage reduction of reduction drive 110 includes second stage ring gear 156 and a plurality of planetary gears 154 mounted on planet carrier 155 by means of pins (not shown). The planetary gears 154 are driven by sun gear 152, thus rotating the planet carrier 155 with respect to second stage ring gear 156, which is fixed in axle housing 140 by means of anti-rotation tabs 156*a* engaged to anti-rotation recesses 130*d* of center housing 130. Splines 155*a* of planet carrier 155 are engaged to output axle splines 131*a* to provide a rotational force to axle 131.

Axle 131 includes a journal bearing 153 which extends into through-bore 152*a* of sun gear 152 such that axle 131 can freely rotate with respect to sun gear 152. Journal bearing 153 is press-fit into sun gear 152 to reduce wear against axle 131 and to allow planetary reduction assembly 150 to run in a lower volume of oil. Bearing 134 is press-fit onto axle 131 and, in combination with an integrally formed gear retention ring 131*b* formed on axle 131, retains the entire gear train (except pinion gear 147) to form a subassembly. This pre-assembled arrangement of axle and gear train components facilitates and improves the subsequent assembly process. At assembly, bearing 134 is disposed in bearing pocket 130*f* shown in FIG. 8 (in the position indicated in FIG. 7) and is used to support axle 131, and spacer 135 assists in locating the ring gear 151. Seal 133 is disposed adjacent axle bearing 132, which abuts axle thrust washer 136, which in turn abuts the gear retention ring 131*b*.

FIG. 9 depicts a hybrid zero-turn vehicle 190 incorporating a frame 192, a pair of electric drives 110L, 110R each driving a respective driven wheel 193 and a pair of caster wheels 195. A prime mover 191 (depicted as an internal combustion engine) is disposed on vehicle 190 and powers power take-off clutch/brake 196 to drive a power transfer assembly 197 (represented here as a belt and pulley assembly) to power blades 198*a* on mowing deck 198. Generator 187 is also connected to prime mover 191 by means of power transfer assembly 189 (shown here as a belt and pulley assembly) and controlled by generator controller 188. It should be noted that generator 187 may optionally be directly driven by an output shaft of prime mover 191. A high voltage battery 175 (e.g., 48V) is engaged to generator 187 and provides power to both drives 110L, 110R.

A control system 170 incorporating different means of controlling and steering the vehicle 190 is depicted in this FIG. 9 and it will be understood that one or more of the depicted systems may not be present, and that the drive assemblies 110 and related components of vehicle 190 shown herein can also be used in an autonomous vehicle. Specifically, this embodiment shows a joystick 199, a steering wheel 180 connected by means of a steering shaft 181 to a steering position sensor 171, and a pair of control levers 183L, 183R each connected to a respective control mechanism 184L, 184R incorporating position sensors and return to neutral mechanisms. A pedal 172 for speed and/or directional control is shown for use if the steering wheel 180 is used. In each case, the steering/control mechanisms are connected to a CAN Bus network 160 incorporating termination modules 168. A vehicle integration module 161 is also connected to network 160. Similar systems are depicted in commonly owned U.S. Pat. No. 10,058,031, the terms of which are incorporated herein by reference. A low voltage battery 176 (e.g. 12V) with a key switch 162 may also be connected to network 160 and to prime mover 191 and clutch/brake 196 for starting/stopping purposes. An optional battery monitor 177 may also be connected to network 160 and high voltage battery 175, although monitor 177 could also be wired directly to vehicle integration module 161.

FIG. 10 depicts a fully electric zero turn vehicle 290 which is similar in many respects to vehicle 190. Vehicle 190 incorporates a frame 292, a pair of electric drives 110L, 110R each driving a respective driven wheel 193 and a pair of caster wheels 195. A high voltage battery 275 (e.g., 48V)

provides power to both drives 110L, 110R and is connected to a charge receptacle 274. Blades 298*a* of mower deck 298 are powered by electric deck motors 285 connected to and controlled by deck controller 286.

As before, a control system 270 incorporating different means of controlling and steering the vehicle 290 is depicted in this FIG. 10 and it will be understood that one or more of the depicted systems may not be present, and that the drive assembly 110 and related components of vehicle 290 shown herein can also be used in an autonomous vehicle. For this embodiment, elements that may be identical to those described above are shown with identical numerals, whereas those elements that may be modified or connected differently are depicted with similar numerals but using a different prefix (e.g., battery 175 and battery 275).

This embodiment also depicts a joystick 199, a steering wheel 180 connected by means of a steering shaft 181 to a steering position sensor 171, and a pair of control levers 183L, 183R each connected to a respective control mechanism 184L, 184R incorporating position sensors and return to neutral mechanisms. A pedal 172 for speed and/or directional control is shown for use if the steering wheel 180 is used. In each case, the steering/control mechanisms are connected to a CAN Bus network 160 incorporating termination modules 168. A vehicle integration module 161 is also connected to battery 275 and network 160, along with a key switch 162. Deck controller 286 may optionally be an analog device and wired directly to vehicle integration module 161. An optional battery monitor 177 may also be connected to network 160 and high voltage battery 275, although monitor 177 could also be wired directly to vehicle integration module 161.

An electric planetary reduction drive 310 is depicted in FIGS. 11-18. Similar to planetary reduction drive 110, planetary reduction drive 310 may be used in lieu of reduction drive 110 in either of the vehicle applications shown in FIGS. 9 and 10.

Planetary reduction drive 310 shares some aspects in common with planetary reduction drive 110 and these will not be discussed in detail. These common aspects include the two stage planetary reduction assembly 350, axle 331, axle housing 340 and wheel hub 341, which may be substantially the same as two stage planetary reduction assembly 150, axle 131, axle housing 140 and wheel hub 141, respectively. Similar to reduction drive 110, the axle housing 340 is attached to a center housing 330 by means of fasteners 317. Four mounting thru-holes 330*g* are formed in center housing 330, but they are arranged in a trapezoidal pattern rather than the square mounting pattern of reduction drive 110.

Figure 12:
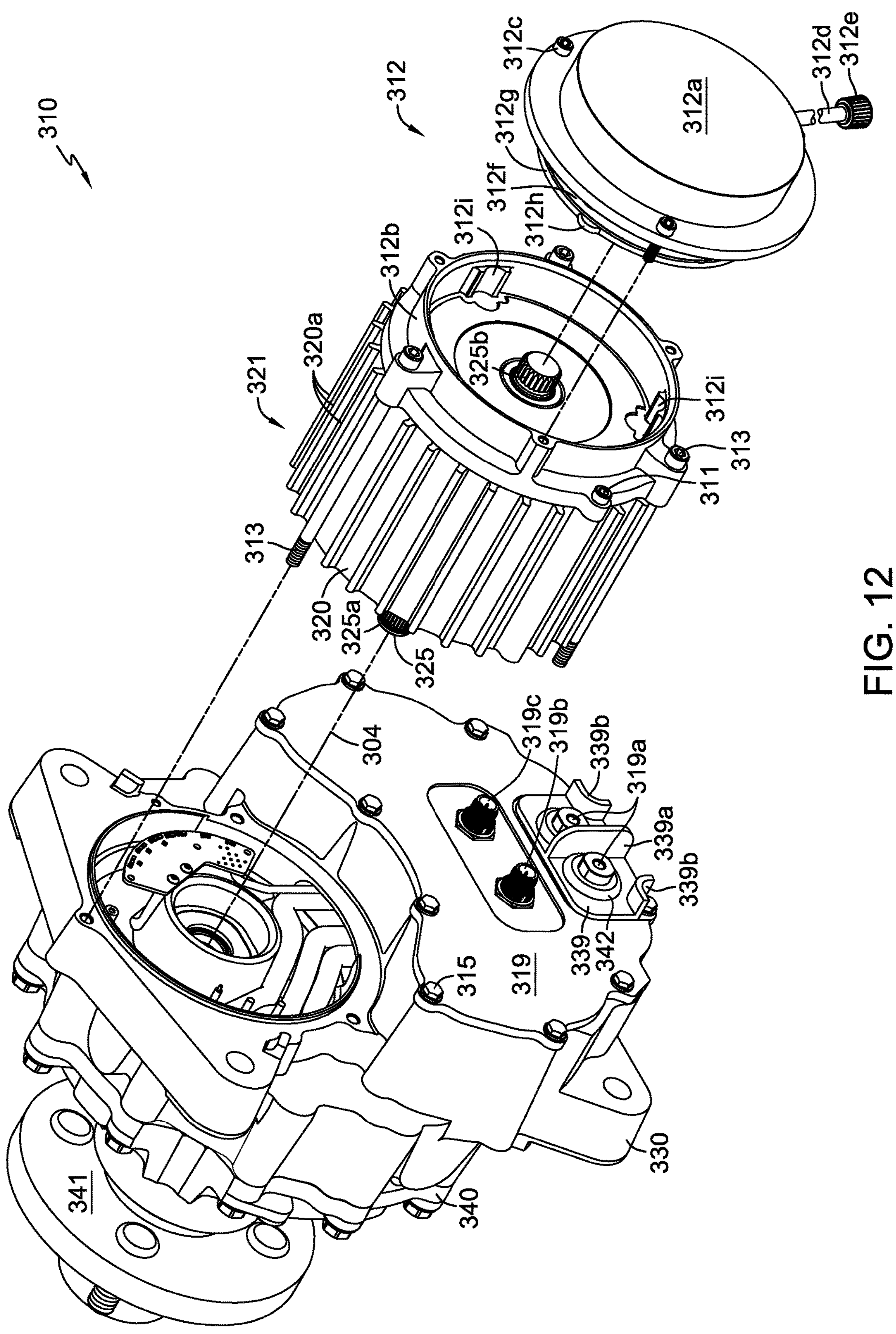
FIG. 12 is a partially exploded view of selected components of the drive assembly of FIG. 11.
Figure 13:
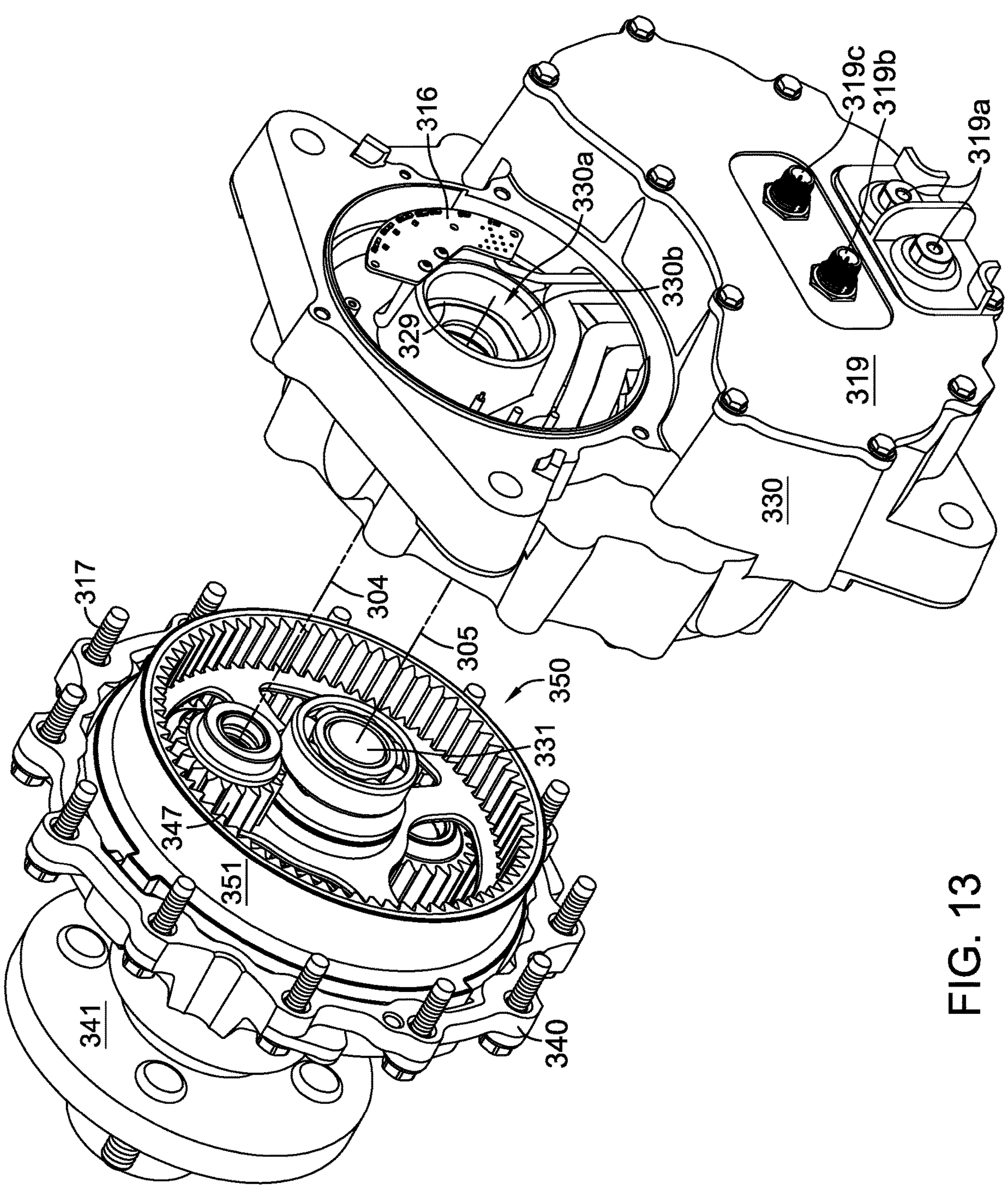
FIG. 13 is a partially exploded view of selected components of the drive assembly of FIG. 11.

Also similar to planetary reduction drive 110, as indicated in FIGS. 12 and 13, motor output shaft 325 has a first axis of rotation 304, and axle 331 has a second axis of rotation 305 that is parallel to and offset from the first axis of rotation 304.

Brushless electric motor 321 is internally similar to brushless electric motor 121 and the internal structure of motor 321 will therefore not be fully described. Additionally, more fully described similar electric motors that may be incorporated into planetary reduction drive 310 with only minor modification are depicted in commonly owned U.S. patent application Ser. No. 16/457,243, the terms of which are incorporated herein by reference. Electric motor 321 includes an output shaft 325 extending through electric motor 321 and supported by a pair of bearings (not shown). One of these bearings is mounted in pocket 330*b* and the other bearing is mounted in a brake housing 312*b* of spring-biased electric brake 312. Shaft 325 extends through opening 330*a* and includes splines 325*a* to engage the pinion gear 347 that drives rotatable first stage ring gear 351 of the planetary reduction assembly 350. As in reduction drive 110, a wave spring 329 is disposed in pocket 330*b* between the bearing mounted therein and the center housing 330 to provide an axial biasing force to the rotor of the electric motor 321. A Hall effect sensor board 316 is attached to the wall of bearing pocket 330*b*.

Brake housing 312*b* is attached to motor housing 320 by means of fasteners 311 to enable pre-assembly of the combined electric motor 321 and electric brake 312. A rotor disc 312*f* of electric brake 312 is sandwiched between two stator discs 312*g* (one shown) and engaged to splines 325*b* of motor output shaft 325 to rotate therewith. A brake cover 312*a* housing an electrical coil (not shown) and biasing spring (not shown) is mounted to the brake housing 312*b* by means of fasteners 312*c* to enclose the rotor disc 312*f* and stator discs 312*g* within brake housing 312*b*. A plurality of anti-rotation projections 312*h* formed on the stator discs 312*g* engage a mating plurality of slots 312*i* to prevent rotation of stator discs 312*g* about first axis 304 while allowing movement of stator discs 312*g* along axis 304. As is known, the biasing spring engages the brake in a fail safe manner when electric brake 312 is not energized. When the electric coil of electric brake 312 is energized, the electric coil exerts an electro-magnetic pulling force on an adjacent stator disc, thereby releasing the clamping force applied by the biasing spring on the stator discs 312*g* and rotor disc 312*f* to allow the output shaft 325 and rotor (not shown) of electric motor 321 to rotate.

Figure 14:
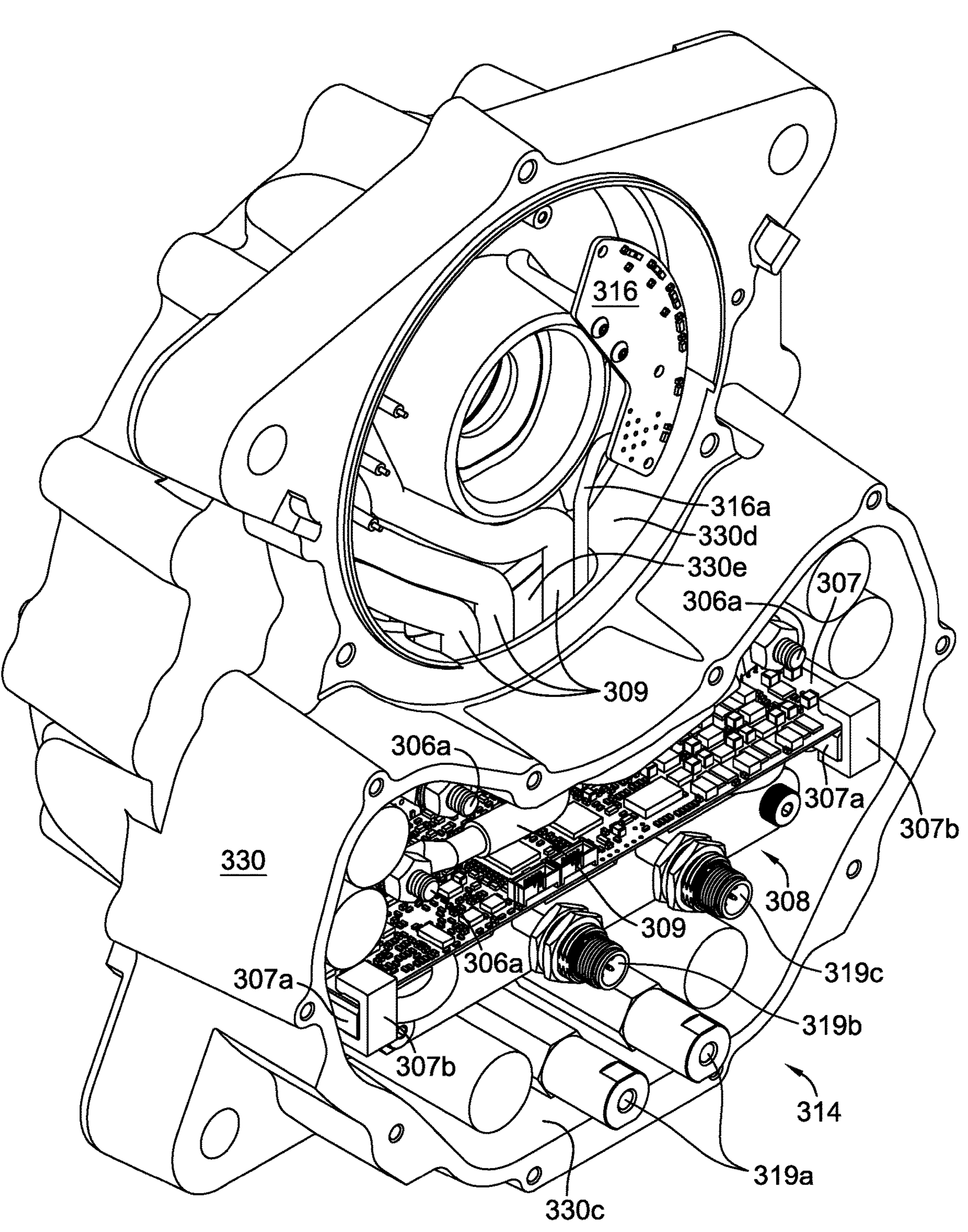
FIG. 14 is an external perspective view of a power and control assembly in a housing of the drive of FIG. 11.

Whereas motor housing 120 includes an electrical access chamber 120*a*, motor housing 320 is a generally cylindrical extruded housing separate from an electrical access chamber 330*c*, and mounted to the center housing 330 by means of fasteners 313. As shown in FIG. 12, motor housing 320 may include fins 320*a* for heat dissipation. As shown in FIG. 14, the electrical access chamber 330*c* and a conductor chamber 330*d* are integrally formed in center housing 330 and connected by a conductor passage 330*e* to accommodate a power and control assembly 314. Three phase conductors 309 and a Hall effect sensor board conductor 316*a* are routed through conductor passage 330*e*. An electrical chamber cover 319 is secured to center housing 330 by means of fasteners 315 to close chamber 330*d*, and DC power terminals 319*a*, CAN Bus connector 319*b* and brake connector 319*c* are provided thereon. Center housing 330 and electrical chamber cover 319 are both preferably formed from an electrically conductive metal, such as aluminum, to reduce electromagnetic interference (EMI). A brake control conductor 312*d* with a brake control connector 312*e* attached thereto extends from the brake cover 312*a*. The brake control connector 312*e* engages mating brake connector 319*c* when reduction drive 310 is fully assembled. CAN Bus connector 319*b* and brake connector 319*c* may be the same style. The DC power terminals 319*a* are separated by a non-conductive isolator 339 and a pair of elastomeric grommets 342. A partition 339*a* and guides 339*b* are formed on isolator 339 to separate, route and protect the vehicle power supply conductors (shown schematically in FIGS. 9 and 10) that are connected to the DC power terminals 319*a*. The grommets 342 engage both isolator 339 and electrical chamber cover 319 to ensure sealing.

Figure 15:
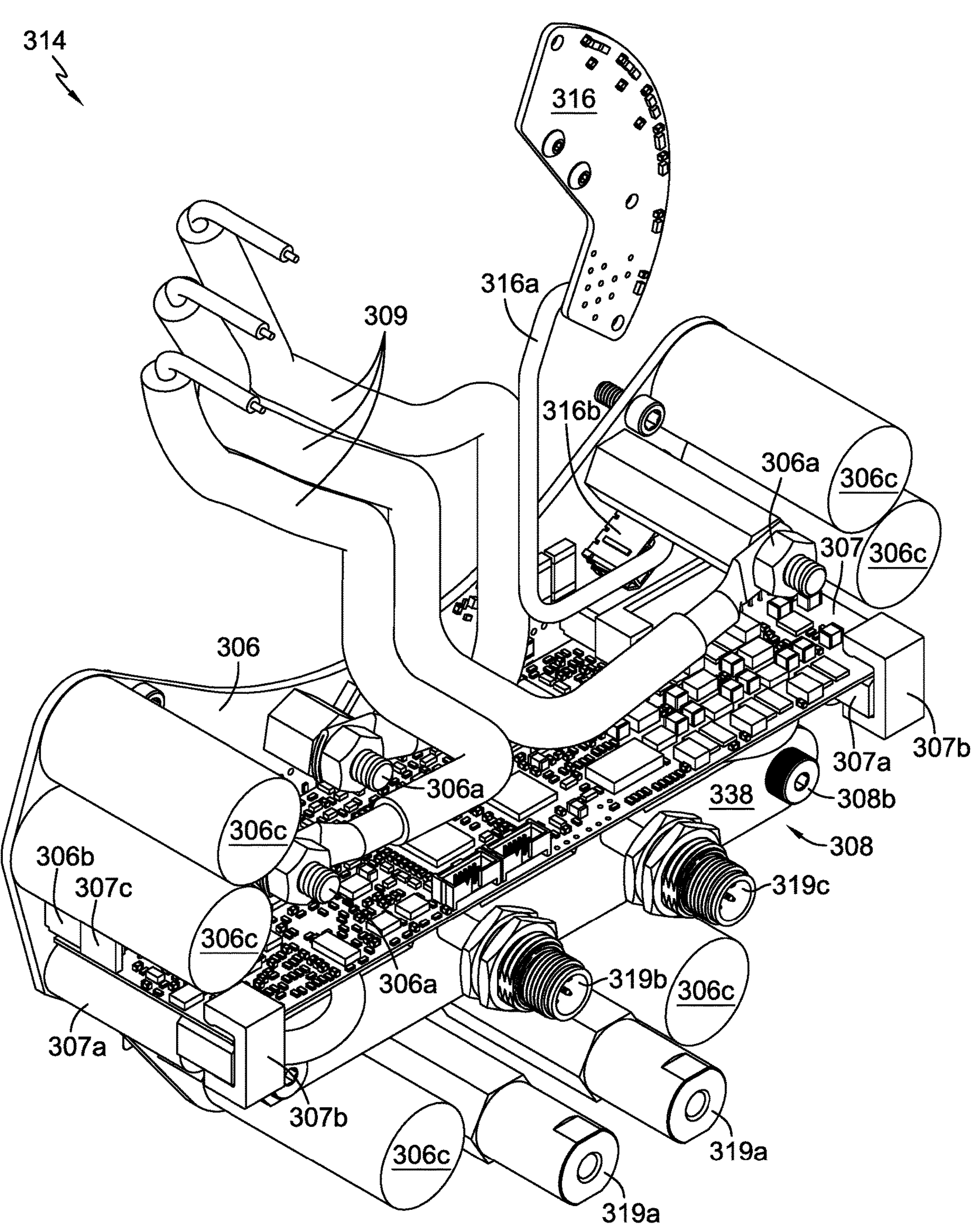
FIG. 15 is an external perspective view of the power and control assembly of FIG. 14.

Center housing 330 is removed in FIG. 15 to show power and control assembly 314 more clearly. A control board 307 is oriented perpendicular to a power board 306 and connected thereto by two control board connectors 307*c* engaged with corresponding power board connectors 306*b*. The control board 307 is supported by two control board support posts 307*a* mounted to the power board 306 and retained in position by two control board clips 307*b* that are in turn retained by the electrical chamber cover 319 when it is installed. Phase conductors 309 supply power between phase terminals 306*a* (attached to the power board 306) and the stator windings (not shown) of electric motor 321. Conductor 316*a* carries signals from the Hall effect sensor board 316 to a printed circuit board (PCB) connector 316*b* mounted on the power board 306.

Figure 16:
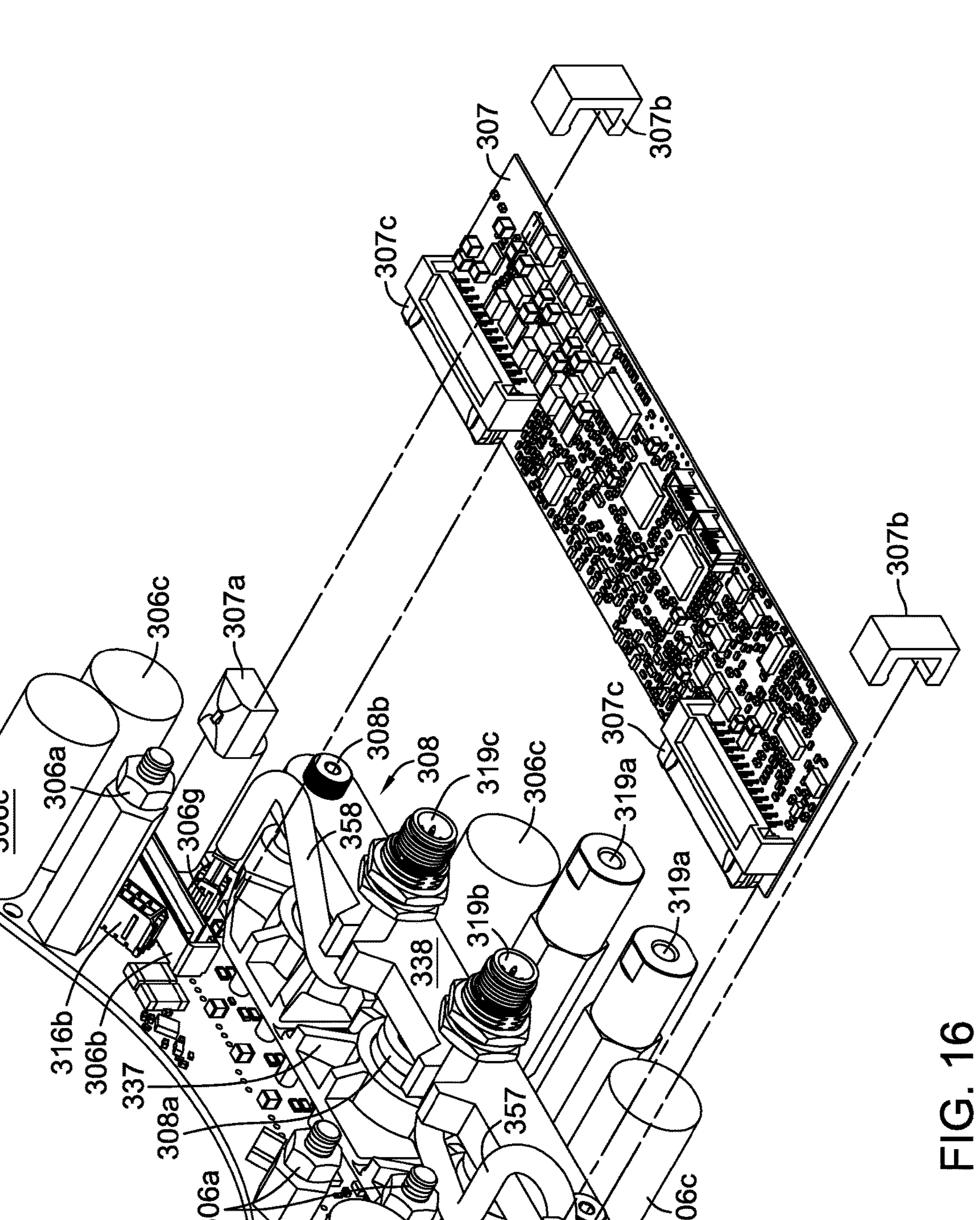
FIG. 16 is a partially exploded view of the power and control assembly of FIG. 15, with selected components removed for clarity.
Figure 17:
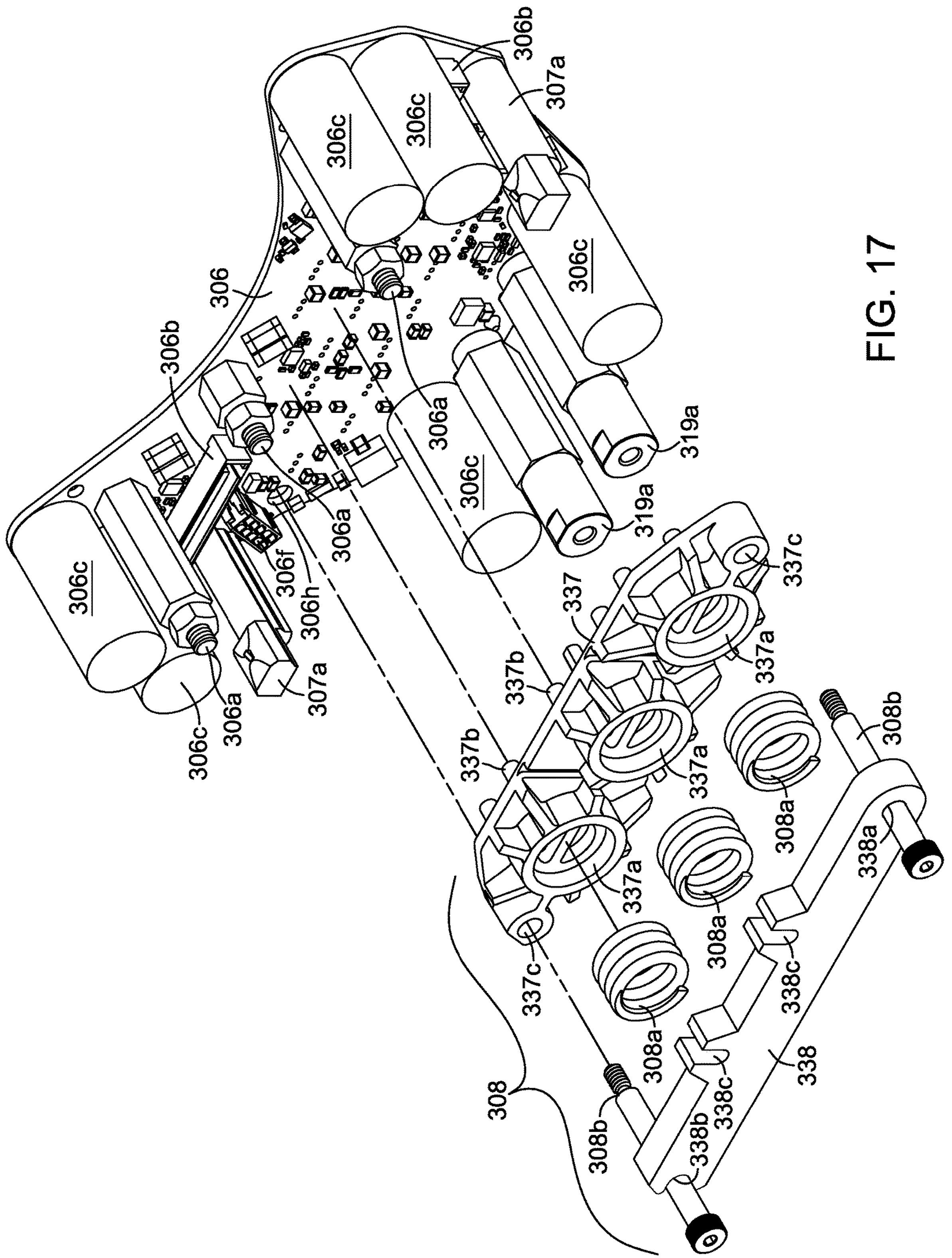
FIG. 17 is a partially exploded view of a power board and compression assembly of the power and control assembly of FIG. 15.
Figure 18:
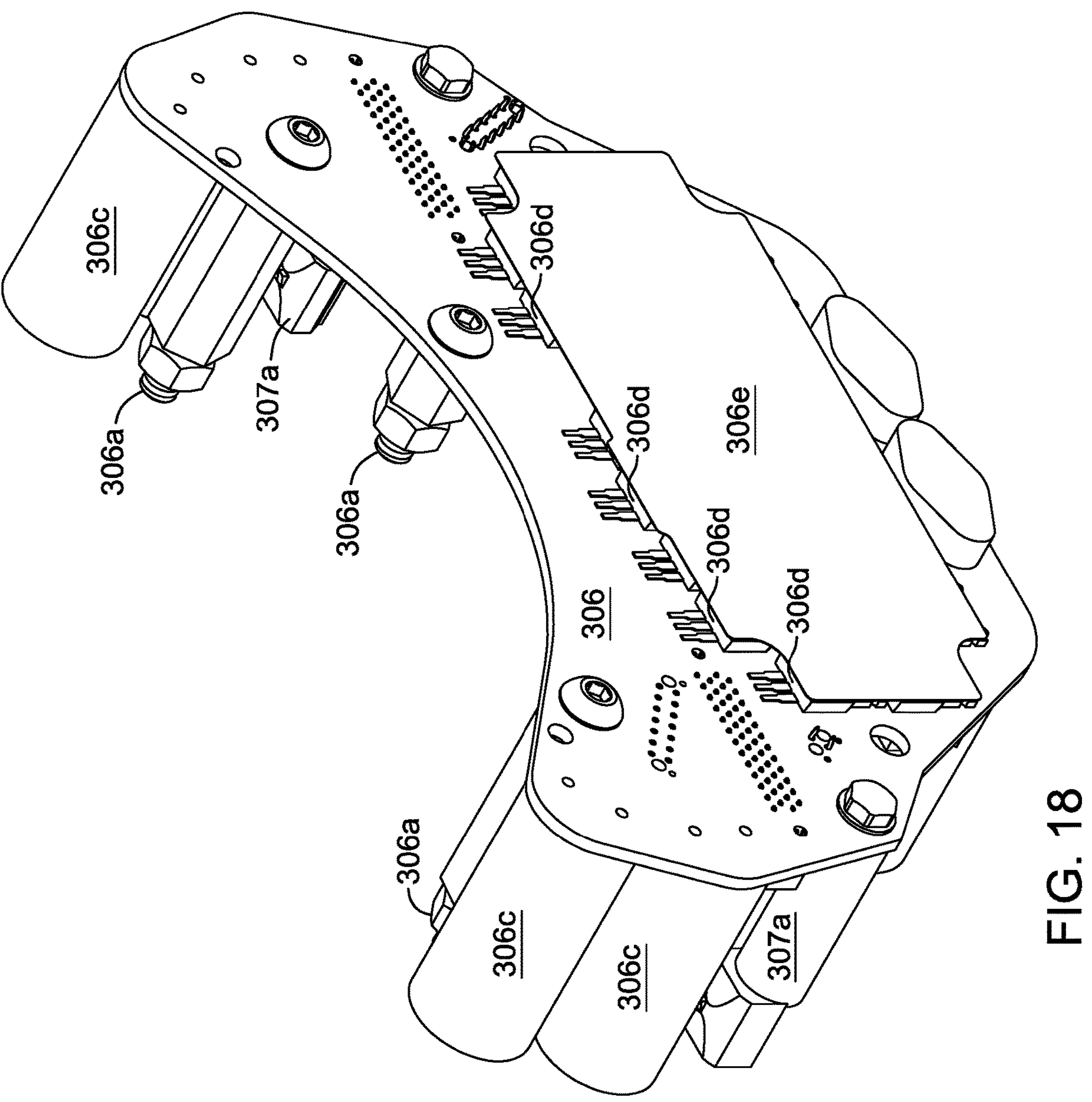
FIG. 18 is an external perspective view of the power board of FIG. 17.

Shown most clearly in FIGS. 16 and 17, compression assembly 308 is provided to apply localized pressure to each of a plurality of field effect transistors (FETs) 306*d* arranged on the back side of power board 306. This multi-point, localized pressure is applied to the front side of power board 306 and ensures that each of the FETs 306*d* is pushed firmly against a thermal pad 306*e* (shown in FIG. 18) that is in contact with center housing 330 to dissipate heat generated by the FETs 306*d*. As shown in FIG. 17, compression assembly 308 includes a compression bridge 337 and a spring retention bar 338 with a plurality of compression springs 308*a* interposed between. The plurality of compression springs 308*a* nests in a plurality of spring pockets 337*a* formed on the compression bridge 337 and the spring retention bar 338 applies pressure evenly to the FETs 306*d* through the plurality of compression springs 308*a* when fasteners 308*b* are installed through mounting hole 338*a* and mounting slot 338*b*, alignment holes 337*c*, and circuit board holes 306*h* to engage and connect to the center housing 330. A plurality of projections 337*b* is formed on a side of bridge 337 opposite the spring pockets 337*a*. Each of the plurality of projections 337*b* applies pressure directly to a first side of power board 306 and indirectly to each FET 306*d* at the approximate center of each of the FETs 306*d* mounted on the opposite side of the power board 306.

The spring retention bar 338 includes conductor routing channels 338*c* to position and retain a CAN Bus conductor 357 and a brake conductor 358. The CAN Bus conductor 357 carries ground drive control signals between CAN Bus connector 319*b* and PCB connector 306*f* mounted on power board 306. The brake conductor 358 carries brake control signals between PCB connector 306*g* mounted on power board 306 and brake connector 319*c*.

A plurality of capacitors 306*c* is positioned on the perimeter of power board 306 in a bilaterally symmetrical arrangement about a plane passing through and parallel to the first axis of rotation 304 and the second axis of rotation 305. The control board connectors 307*c* and corresponding power board connectors 306*b*, along with the control board support posts 307*a* and control board retention clips 307*b* are arranged cooperatively and in bilateral symmetry about this same plane to connect, support and retain control board 307 in a balanced orientation.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any equivalent thereof.

What is claimed is:

1. A drive assembly, comprising:

a center housing having a first side and a second side opposite the first side;

a motor housing secured to the first side of the center housing;

an axle housing secured to the second side of the center housing;

an electric motor disposed in the motor housing and configured to drive a motor output shaft extending away from the first side of the center housing and having a first axis of rotation;

a pinion gear disposed at least partially within the center housing and engaged to and driven by the motor output shaft;

a plurality of planetary gears at least partially disposed in the axle housing and driven by the pinion gear; and an axle shaft extending away from the second side of the center housing to connect with and drive a wheel hub.

2. The drive assembly of claim 1, further comprising an electrically conductive access cover attached to the center housing.

3. The drive assembly of claim 2, further comprising a CAN Bus connector, a brake connector, and DC power terminals that are arranged on the electrically conductive access cover.

4. The drive assembly of claim 3, wherein the DC power terminals are insulated and sealed by respective elastomeric grommets and separated by a non-conductive isolator.

5. The drive assembly of claim 4, wherein the elastomeric grommets sealingly engage the non-conductive isolator and the electrically conductive access cover.

6. The drive assembly of claim 1, further comprising:

a bearing pocket on the first side of the center housing; and a bearing disposed in the bearing pocket to support the motor output shaft.

7. The drive assembly of claim 6, further comprising a Hall Effect sensor connected to a portion of the bearing pocket and disposed adjacent to a rotor of the electric motor.

8. The drive assembly of claim 6, wherein the drive assembly further comprises a wave spring disposed in the bearing pocket and applying an axial biasing force to a rotor of the electric motor.

9. The drive assembly of claim 1, further comprising an electric brake attached to the motor housing and engaged to the motor output shaft.

10. The drive assembly of claim 1, further comprising a power and control assembly electrically coupled to the electric motor, wherein the power and control assembly includes a power board and a control board.

11. The drive assembly of claim 10, wherein the power and control assembly further comprises:

a plurality of board connectors configured to connect the control board to the power board such that the control board is in a perpendicular orientation relative to the power board; and a plurality of support posts mounted to the power board and configured to support the control board in the perpendicular orientation.

12. The drive assembly of claim 10, wherein the power and control assembly further comprises a plurality of field effect transistors mounted on the power board.

13. The drive assembly of claim 12, wherein the power and control assembly further comprises a thermal pad positioned between and contacting the plurality of field effect transistors and the center housing.

14. A drive assembly, comprising:

a center housing having a first side and a second side opposite the first side;

a motor housing extending from the first side of the center housing;

an axle housing extending from the second side of the center housing;

a pinion gear positioned at least partially within the center housing;

an electric motor disposed within the motor housing, the electric motor comprising a motor shaft extending into the center housing along a first axis to engage the pinion gear;

a plurality of planetary gears at least partially disposed in the axle housing, the plurality of planetary gears driven by rotation of the pinion gear; and an axle shaft extending away from the second side of the center housing to connect with and drive a wheel bub.

15. The drive assembly of claim 14 further comprising an electric brake attached to the motor housing and engaged to the motor shaft.

16. The drive assembly of claim 15, wherein the drive assembly further comprises:

a seal pocket on the motor housing; and a seal disposed in the seal pocket to isolate the electric brake from the electric motor.

17. The drive assembly of claim 15, wherein the electric brake comprises a rotor disk positioned between two stator discs and engaged to the motor shaft.

18. The drive assembly of claim 17, wherein the electric brake is disposed in a brake housing and the two stator discs include a plurality of anti-rotation projections configured to engage a plurality of slots of the brake housing to prevent rotation of the two stator discs along the first axis.

19. The drive assembly of claim 14, wherein the axle shaft is driven by the plurality of planetary gears and extends from the axle housing along a second axis.

20. The drive assembly of claim 19, wherein the second axis is radially offset from but parallel to the first axis.

21. The drive assembly of claim 19, further comprising:

a bearing pocket on the second side of the center housing; and a bearing disposed in the bearing pocket to support the axle shaft.

22. The drive assembly of claim 21, further comprising a gear retention ring fixed on the axle shaft and configured to act in combination with the bearing to retain the plurality of planetary gears in position.

* * * * *